United States Patent
Lazur et al.

(10) Patent No.: US 9,512,044 B2
(45) Date of Patent: Dec. 6, 2016

(54) CERAMIC MATRIX COMPOSITES AND METHODS FOR PRODUCING CERAMIC MATRIX COMPOSITES

(71) Applicant: Rolls-Royce Corporation, Indianapolis, IN (US)

(72) Inventors: Andrew J. Lazur, Huntington Beach, CA (US); Adam L. Chamberlain, Mooresville, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 281 days.

(21) Appl. No.: 14/204,820

(22) Filed: Mar. 11, 2014

(65) Prior Publication Data
US 2016/0107940 A1 Apr. 21, 2016

Related U.S. Application Data

(60) Provisional application No. 61/787,235, filed on Mar. 15, 2013.

(51) Int. Cl.
| | |
|---|---|
| *C23C 16/00* | (2006.01) |
| *C04B 41/45* | (2006.01) |
| *C04B 35/573* | (2006.01) |
| *C04B 35/591* | (2006.01) |
| *C04B 35/626* | (2006.01) |

(Continued)

(52) U.S. Cl.
CPC ......... *C04B 41/4584* (2013.01); *C04B 35/573* (2013.01); *C04B 35/591* (2013.01); *C04B 35/6269* (2013.01); *C04B 35/62863* (2013.01); *C04B 35/62868* (2013.01); *C04B 35/62884* (2013.01); *C04B 35/62894* (2013.01); *C04B 35/62897* (2013.01); *C04B 35/806* (2013.01); *C04B 41/009* (2013.01); *C04B 41/0072* (2013.01); *C04B 41/457* (2013.01); *C04B 41/5059* (2013.01); *C04B 41/5064* (2013.01); *C04B 41/52* (2013.01); *C04B 41/87* (2013.01); *C23C 16/325* (2013.01); *C04B 2235/386* (2013.01); *C04B 2235/3826* (2013.01); *C04B 2235/422* (2013.01); *C04B 2235/465* (2013.01); *C04B 2235/483* (2013.01); *C04B 2235/5244* (2013.01); *C04B 2235/614* (2013.01); *C04B 2235/616* (2013.01); *C04B 2235/6581* (2013.01); *C04B 2235/79* (2013.01); *C04B 2235/96* (2013.01); *C04B 2235/9607* (2013.01)

(58) Field of Classification Search
CPC ....... C23C 16/342; C23C 16/325; C23C 16/32
USPC ....................... 427/255.38, 255.28
See application file for complete search history.

(56) References Cited

U.S. PATENT DOCUMENTS

| 4,415,609 A | 11/1983 | Debolt et al. |
| 4,476,178 A | 10/1984 | Veltri et al. |

(Continued)

OTHER PUBLICATIONS

Yun et al., "Comparison of the Tensile, Creep, and Rupture Strength Properties of Stoichiometric SiC Fibers", 23rd Annual Cocoa Beach Conference, Jul. 1999, 16 pages.

(Continued)

*Primary Examiner* — Kelly M Gambetta
(74) *Attorney, Agent, or Firm* — Brinks Gilson & Lione

(57) ABSTRACT

A ceramic matrix composite includes a plurality of fibers embedded in a matrix. The composition of the matrix is selected to achieve a desired relationship between the mechanical and thermal properties of the matrix and the fibers.

23 Claims, 3 Drawing Sheets

(51) Int. Cl.
*C04B 35/628* (2006.01)
*C04B 35/80* (2006.01)
*C04B 41/00* (2006.01)
*C04B 41/50* (2006.01)
*C04B 41/52* (2006.01)
*C04B 41/87* (2006.01)
*C23C 16/32* (2006.01)

(56) References Cited

U.S. PATENT DOCUMENTS

| | | |
|---|---|---|
| 4,628,002 A | 12/1986 | Suplinskas et al. |
| 4,980,202 A | 12/1990 | Brennan et al. |
| 5,021,367 A | 6/1991 | Singh et al. |
| 5,202,105 A * | 4/1993 | Boecker ............... B82Y 30/00 117/7 |
| 5,397,595 A | 3/1995 | Carroll et al. |
| 5,652,030 A | 7/1997 | Delperier et al. |
| 5,952,100 A | 9/1999 | Corman et al. |
| 5,968,653 A | 10/1999 | Coppella et al. |
| 6,001,419 A | 12/1999 | Leluan et al. |
| 6,133,396 A * | 10/2000 | Laine ..................... C08G 77/60 528/14 |
| 6,197,374 B1 | 3/2001 | Huttinger et al. |
| 6,596,340 B1 | 7/2003 | Schneweis |
| 6,630,200 B2 | 10/2003 | Wang et al. |
| 7,252,860 B2 | 8/2007 | Peetz et al. |
| 7,687,016 B1 * | 3/2010 | DiCarlo ................. C04B 35/565 264/624 |
| 7,736,554 B2 | 6/2010 | Thebault et al. |
| 7,799,375 B2 | 9/2010 | Rashed et al. |
| 7,959,973 B2 | 6/2011 | Waghray et al. |
| 2004/0127600 A1 * | 7/2004 | Bauer ................... C04B 35/522 523/152 |
| 2008/0193702 A1 * | 8/2008 | Cupta ..................... C08K 7/02 428/66.2 |
| 2009/0092786 A1 | 4/2009 | Liu et al. |
| 2011/0187030 A1 * | 8/2011 | Matsunaga ......... C04B 35/5603 264/634 |
| 2012/0076927 A1 * | 3/2012 | Bhatt .................... C04B 35/565 427/122 |

OTHER PUBLICATIONS

Invitation to Pay Additional Fees and, Where Applicable, Protest Fee for PCT International Application Serial No. PCT/US2014/02134, dated Jun. 18, 2014.

Notification of Transmittal of the International Search Report and the Written Opinion of the International for International Application No. PCT/US2014/023134, dated Aug. 4, 2016.

* cited by examiner

CERAMIC MATRIX COMPOSITES AND METHODS FOR PRODUCING CERAMIC MATRIX COMPOSITES

RELATED APPLICATIONS

This application is related to and claims priority to U.S. Provisional Patent Application Ser. No. 61/787,235, filed on Mar. 15, 2013 entitled "Ceramic Matrix Composites and Methods for Producing Ceramic Matrix Composites." The subject matter disclosed in that provisional application is hereby expressly incorporated into the present application in its entirety.

FIELD OF THE DISCLOSURE

The present disclosure relates generally to ceramic matrix composites, and more specifically to ceramic matrix composites in which the thermal and mechanical properties of the matrix and those of the fiber are matched in a desired relationship by manipulation of the main matrix components and/or the introduction of additional elements into the matrix.

BACKGROUND

Ceramic Matrix Composites (CMS's) are materials that include ceramic fibers embedded in a ceramic matrix. CMC's typically exhibit desirable mechanical, chemical and physical properties at high temperatures. For example, CMS's are typically more resistant to oxidation at high temperatures than are metals. CMC's are generally tougher than monolithic ceramics and exhibit damage tolerance. SiC/SiC CMC's are one example of a composite material that exhibits excellent high temperature mechanical, physical and chemical properties. Such materials are suitable for a number of high temperature applications, such as use in producing hot sector components of gas turbine engines. SiC/SiC CMC engine components allow gas turbine engines to operate at much higher temperatures than engines having superalloy metal components.

The mechanical and thermal properties (such as creep, fatigue strength, elastic modulus, etc.) of the matrix and fiber components of CMC's, and the relationship between those properties, can affect their performance. For example, like other materials, CMC's creep under stress. The relative rates of creep between the matrix and the fibers affect the way in which the CMC bears loads to which it is subjected. For example, if the matrix and fibers exhibit the same amount of creep, they will share the load in the same ratio. However, if the fiber is more creep resistant than the matrix, the matrix will begin to creep first and to a greater extent, which results in the load shifting from the matrix to the fiber. This is acceptable in certain applications because the fiber strength is significantly higher than that of the matrix. For example, depending on the fiber and matrix, the fiber may be approximately 4 to 10 times stronger than the matrix. The differential creep rates also result in a higher matrix cracking stress.

CMC's may be produced by a variety of processes. One process for producing CMC's uses chemical vapor infiltration (CVI) to deposit the matrix material on a network of fibers.

SUMMARY

The present application discloses one or more of the features recited in the appended claims and/or the following features which, alone or in any combination, may comprise patentable subject matter.

A method for producing a ceramic matrix composite may include the steps of forming a network of fibers and depositing a matrix material having a first component and a second component on the network of fibers, wherein one of the first and second components is deposited in an amount greater than its stoichiometric amount in relation to the other component.

In some embodiments the method may include the step of depositing the first component in an amount greater than its stoichiometric amount in relation to the second component to produce a matrix with less creep resistance than that of the fibers.

In some embodiments the first component may be silicon and the second component may be carbon. In other embodiments, the first component may be carbon and the second component may be silicon.

In some embodiments, the method may include the step of depositing a third component with the matrix material to produce a matrix with approximately the same creep resistance as that of the fibers. In some embodiments, the third component may also be a component of the fibers.

In other embodiments, the method may include the step of depositing an interface layer on the fiber network before depositing the matrix material. In some embodiments, the interface layer may include boron nitride. In other embodiments, the interface layer may include silicon doped boron nitride.

In other embodiments, the method may include the step of depositing a first interface layer and a second interface layer on the fiber network before depositing the matrix material. In some embodiments, the first interface layer may include boron doped silicon carbide. In other embodiments, the second interface layer may include silicon doped boron nitride.

In some embodiments of the invention, the method may include depositing the matrix material by chemical vapor infiltration. In some embodiments, the chemical vapor infiltration is carried out at a temperature between about 300° C. to about 2000° C. In some embodiments, the chemical vapor infiltration is carried out at a pressure between about 0.1 torr to about 10 atm.

In some embodiments of the invention, the method may include processing the ceramic matrix composite by polymer infiltration and pyrolysis, slurry infiltration and/or melt infiltration.

In other embodiments, the method may include heat treating the ceramic matrix composite.

In some embodiments, the method may include prestressing the ceramic matrix composite.

A ceramic matrix composite may include a matrix having a creep rate at a specified temperature, the matrix including a first component and a second component with one of the first and second components present in an amount greater than its stoichiometric amount in relation to the other component. The ceramic matrix composite may further include a plurality of fibers embedded in the matrix, with the fibers having a lower creep rate at the specified temperature than the creep rate of the matrix.

In some embodiments, the first component is present in an amount greater than its stoichiometric amount in relation to the second component. In some embodiments, the first component may be silicon and the second component may be carbon. In other embodiments, the first component may be carbon and the second component may be silicon.

In some embodiments, the matrix may include a third component that is also a component of the fibers.

In other embodiments, the ceramic matrix composite includes at least one interface layer between the fibers and the matrix. In some embodiments, the interface layer may include boron nitride. In other embodiments, the interface layer may include silicon doped boron nitride.

A ceramic matrix composite may include a matrix having a creep rate at a specified temperature, the matrix including a first component and a second component with one of the first and second components present in an amount greater than its stoichiometric amount in relation to the other component. The ceramic matrix composite may further include a plurality of fibers embedded in the matrix, the fibers having approximately the same creep rate at the specified temperature as the creep rate of the matrix.

In some embodiments, the first component is present in an amount greater than its stoichiometric amount in relation to the second component. In some embodiments, the first component may be silicon and the second component may be carbon. In other embodiments, the first component may be carbon and the second component may be silicon.

In some embodiments, the matrix may include a third component that is also a component of the fibers.

In other embodiments, the ceramic matrix composite includes at least one interface layer between the fibers and the matrix. In some embodiments, the interface layer may include boron nitride. In other embodiments, the interface layer may include silicon doped boron nitride.

A method for producing a ceramic matrix composite having a plurality of fibers embedded in a matrix having a first major component and a second major component may include the steps of determining a desired relationship between a thermal or mechanical property of the fibers and the matrix, forming a network of the fibers and depositing the first major component and the second major component on the network, wherein the first major component is deposited in an amount greater than its stoichiometric amount in relation to the second major component to achieve the desired relationship.

A method for producing a ceramic matrix composite having a plurality of fibers embedded in a matrix having a first major component and a second major component may include the steps of determining a desired relationship between a thermal or mechanical property of the fibers and the matrix, forming a network of the fibers and depositing the first major component, the second major component and a third component on the fiber network to achieve the desired relationship.

A method for producing a composite material having a plurality of fibers embedded in a matrix having a first major component and a second major component may include the steps of determining a desired relationship between a thermal or mechanical property of the fibers and the matrix, forming a network of the fibers and depositing the first major component, the second major component and a third component on the fiber network to achieve the desired relationship. In some embodiments, the composite material is a ceramic matrix composite.

A method for producing a composite material having a plurality of fibers embedded in a matrix having a first major component and a second major component may include the steps of determining a desired relationship between a thermal or mechanical property of the fibers and the matrix, forming a network of the fibers and depositing the first major component and the second major component on the network, wherein the first major component is deposited in an amount greater than its stoichiometric amount in relation to the second major component to achieve the desired relationship. In some embodiments, the composite material is a ceramic matrix composite.

These and other features of the present disclosure will become more apparent from the following description of the illustrative embodiments.

DETAILED DESCRIPTION OF THE DRAWINGS

Figure 1:
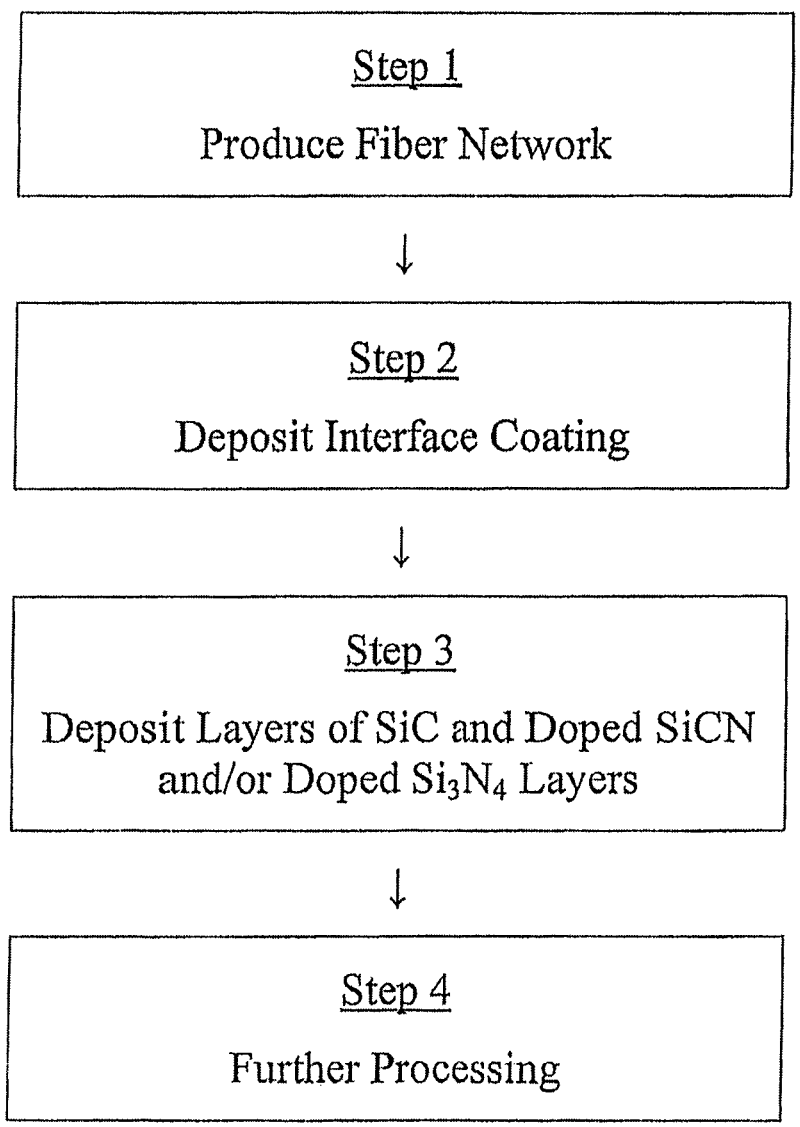
FIG. 1 is a flow chart illustrating a process for producing CMC's according to embodiments of the present invention.
Figure 2:
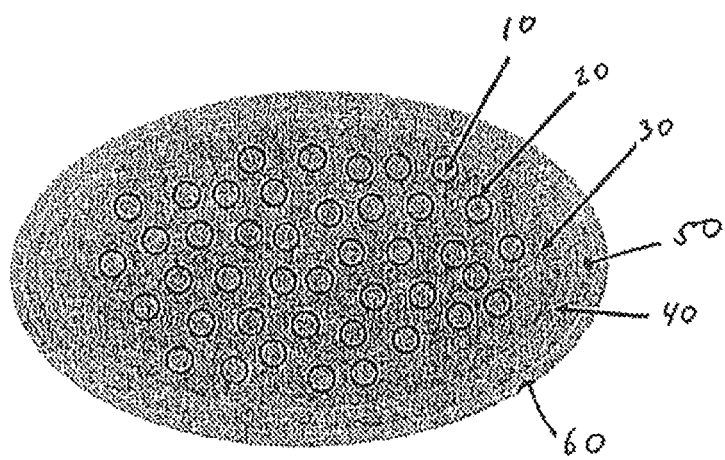
Figure 3:
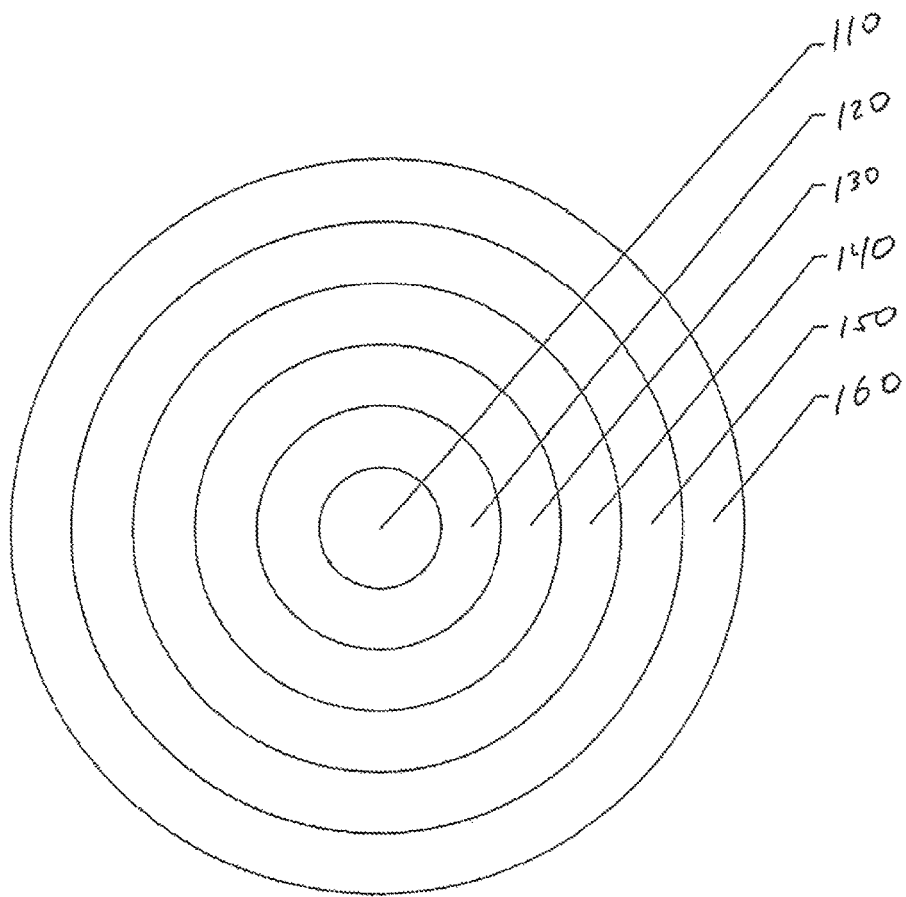

For the purposes of promoting an understanding of the principles of the disclosure, reference will now be made to a number of illustrative embodiments illustrated in the drawings and specific language will be used to describe the same.

The present invention produces CMC's in which the mechanical and thermal properties of the matrix and fibers are matched in a desired relationship. For example, relative creep properties of the matrix can be matched to those of the fiber in a desired relationship by manipulation of the relative amounts of the main components of the matrix and the introduction of other elements. For example, in a SiC/SiC CMC, the matrix may be tailored in a variety of ways, such as by (1) depositing Si in excess of stoichiometric amounts, (2) depositing C in excess of stoichiometric amounts, (3) introducing oxygen containing gases during matrix deposition and/or (4) introducing halogen and/or organometallic gaseous species to incorporate desired elements, such as Al, Zr, B, N, Ti, Nb, Mo, Y, Yb and/or other elements.

FIG. 1 is a flow chart illustrating a process for producing CMC's according to embodiments of the present invention. In Step 1 of the process, a fiber network is produced. For example, the fiber network can be a near net shape preform of a component, such as a component for a gas turbine engine. Fiber volume may range between about 15% and about 50%. More specifically, the fiber volume will typically range between about 30% and about 40%.

The fiber preform may be coated with one or more interface coatings (Step 2). The interface coatings can be selected to perform a number of functions, such as resisting crack propagation, increasing toughness of the matrix, improving bonding between the matrix and the fibers or producing other desirable results. The fibers may be coated by CVI or other methods.

The main matrix material and additional elements are deposited on the fibers in Step 3. The materials are deposited by a CVI process in which gases are introduced into a furnace and are deposited on the fiber preform through chemical reaction and infiltration. The gases may be activated by thermal energy, ultraviolet light, microwaves or other means. Deposition typically occurs at a temperature between about 300° C. to about 2000° C., depending on the process and materials selected. Furnace pressure typically ranges from about 0.1 torr to about 10 atm. The thickness of the matrix material can be adjusted to vary the initial load sharing conditions between the fibers and the matrix.

The relative amounts of the main matrix materials and the additional elements are selected based on the composition of the fiber and the desired relationship between the matrix and fiber characteristics of interest. For example, in applications where it is desirable to have the matrix and fiber creep at approximately the same rate, the additional elements introduced into the matrix include elements found in the fiber or elements with similar creep characteristics. In certain embodiments of the invention, greater matrix creep is attained by introducing excess amounts of one of the main matrix materials.

The CMC may undergo further processing after deposition of the matrix material. (Step 4) For example, the CMC may be further processed by polymer infiltration and pyrolysis (PIP), slurry infiltration, melt infiltration, further CVI, heat treating to obtain a desired material microstructure or combinations of the foregoing. In some cases it may be desirable to precondition a component by stressing it at elevated temperature to increase the matrix cracking stress. This may be particularly desirable when the matrix exhibits greater creep than the fiber.

The following are theoretical examples of CMC's and methods for producing CMC's according to certain embodiments of the invention.

Example 1

A preform for a nozzle guide vane for a turbine engine is produced from a silicon carbide fiber, such as Hi-Nicalon fiber produced by Nippon Carbon Company, Ltd. of Tokyo, Japan. The preform is approximately 36% fiber volume. A boron nitride (BN) interface coating approximately 0.5 um thick is applied to the fiber preform. The boron nitride coating isolates the fibers from the matrix in the finished product, thereby resisting crack propagation and improving toughness of the CMC. Other interface coatings can be applied to achieve the same results. A SiC coating approximately 6 um thick is applied to the preform by CVI. The coating includes either about 10% to about 20% Si in excess of stoichiometric amounts or about 10% to about 20% C in excess of stoichiometric amounts. Ammonia ($NH_3$) is introduced during CVI to produce oxygen and nitrogen inclusions of about 0.2% to about 2% in the SiC coating. The CMC matrix is then subjected to SiC and carbon powder slurry infiltration followed by Si melt infiltration. The slurry components react with the silicon to form ceramic compositions. The melt infiltration process is performed at a pressure of about 0.1 torr and a temperature between about 1400° C. and about 1500° C. using Si that is at least approximately 99% pure. The resulting CVI matrix creeps approximately 10% more than the fiber. The CMC has a stress rupture life in air at 1200° C. that is approximately 30% greater than the stress rupture life of a CMC with a stoichiometric SiC matrix. The matrix cracking stress improves by approximately 15% within 100 hours of exposure to stress at elevated temperature.

Example 2

A preform for a low pressure turbine blade for a gas turbine engine is produced from an aluminum containing silicon carbide fiber, such as Tyranno SA3 fiber produced by Ube Industries, Ltd. of Tokyo, Japan. The preform is approximately 30% fiber volume. An Si doped boron nitride interface coating approximately 0.8 um thick is applied to the fiber preform. The addition of Si to the BN coating improves oxidation resistance. Other interface coatings can be applied to achieve the same results. An SiC coating approximately 8 um to approximately 12 um thick is applied to the preform by CVI. The coating includes either about 10% to about 20% Si in excess of stoichiometric amounts or about 10% to about 20% C in excess of stoichiometric amounts. Aluminum is introduced during CVI through the chlorination of approximately 99.9% pure Al. This results in aluminum inclusion between about 0.05% and about 2% in the SiC deposit. The CMC matrix is then subjected to SiC and carbon powder slurry infiltration followed by Si melt infiltration. The slurry components react with the silicon to form ceramic compositions. The melt infiltration process is performed at a pressure of about 0.1 torr and a temperature between about 1400° C. and about 1500° C. using Si that is at least approximately 99% pure. The resulting CVI matrix creeps approximately 15% more than the fiber. The CMC has a stress rupture life in air at 1200° C. that is approximately 20% greater than the stress rupture life of a CMC with a stoichiometric SiC matrix. Within 100 hours of exposure to stress and temperature the matrix cracking stress improves by approximately 15%.

Example 3

A preform for a low pressure turbine blade for a gas turbine engine is produced from a silicon carbide fiber, such as a ceramic grade (CG) Nicalon fiber produced by Nippon Carbon Company, Ltd. of Tokyo, Japan. The preform is approximately 40% fiber volume. A boron doped SiC layer of approximately 0.1 um to approximately 0.2 um is deposited on the preform by CVI. An Si doped boron nitride interface coating approximately 0.8 um thick is then applied. The boron doped SiC layer improves bonding between the fibers and the Si doped boron nitride layer. Other intermediate interface coatings can be applied to achieve the same results. An SiC coating approximately 4 um to approximately 6 um thick is applied to the preform by CVI. The coating includes either about 10% to about 20% Si in excess of stoichiometric amounts or about 10% to about 20% C in excess of stoichiometric amounts. Oxygen and nitrogen are introduced during CVI by the introduction of air to form an Si, C, O and N deposition. The CMC matrix is then subjected to SiC and carbon powder slurry infiltration followed by polymer infiltration and pyrolysis (PIP). The PIP is converted to an SiNC composition by curing in the presences of $NH_3$. The resulting CVI matrix creeps at approximately the same rate as the fiber. The CMC has a stress rupture life in air at 1000° C. that is approximately 20% greater than the stress rupture life of a CMC with a stoichiometric SiC matrix.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:

1. A method of producing a ceramic matrix composite, comprising the steps of:
   forming a network of silicon carbide fibers;
   depositing an interface layer on the silicon carbide fibers before depositing a matrix material; and
   depositing the matrix material comprising silicon and carbon onto the silicon carbide fibers to form silicon carbide;
   wherein the depositing the matrix material comprises at least one of the group consisting of (1) depositing substantial amounts of silicon in excess of silicon carbide stoichiometric amounts, (2) introducing an oxygen containing gas, (3) introducing a halogen gaseous species, (4) introducing an organometallic gaseous species, or (5) a combination thereof and wherein the depositing the matrix material comprises depositing silicon in an amount in excess of the silicon carbide stoichiometric amount, wherein the excess amount is about 10 atomic percent to about 20 atomic percent.

2. The method of claim 1, wherein the matrix material has approximately the same creep resistance as that of the silicon carbide fibers.

3. The method of claim 1, wherein the interface layer includes boron nitride.

4. The method of claim 1, wherein the matrix material is deposited by chemical vapor infiltration.

5. The method of claim 1, further including processing the ceramic matrix composite by polymer infiltration and pyrolysis.

6. The method of claim 1, further including processing the ceramic matrix composite by slurry infiltration.

7. The method of claim 1, further including processing the ceramic matrix composite by melt infiltration.

8. The method of claim 1, wherein the matrix material comprises oxygen from introducing an oxygen containing gas during deposition of the matrix material.

9. The method of claim 1, wherein the matrix material comprises at least one element of the group consisting of aluminum, zirconium, boron, nitrogen, titanium, niobium, molybdenum, yttrium, ytterbium, or a combination thereof from introducing a halogen gaseous species during deposition of the matrix material.

10. The method of claim 1, wherein the matrix material comprises at least one element of the group consisting of aluminum, zirconium, titanium, niobium, molybdenum, yttrium, ytterbium or a combination thereof from introducing an organometallic gaseous species during deposition of the matrix material.

11. A method of producing a ceramic matrix composite, comprising the steps of:
    forming a network of silicon carbide fibers;
    depositing an interface layer on the silicon carbide fibers network before depositing a matrix material; and
    depositing the matrix material comprising silicon and carbon onto the silicon carbide fibers to form silicon carbide,
    wherein the deposited matrix material comprises at least one of the group consisting of 1) an amount of silicon or carbon in excess of silicon carbide stoichiometric amounts, 2) at least one element selected from the group consisting of aluminum, zirconium, boron, nitrogen, titanium, niobium, molybdenum, yttrium, ytterbium, oxygen or a combination thereof, or 3) a combination of (1) and (2); and
    wherein the amount of silicon or carbon in excess of silicon carbide stoichiometric amounts is about 10 atomic percent to about 20 atomic percent.

12. The method of claim 11, wherein the deposited matrix material comprises about 0.2% to about 2% of inclusions containing an element selected from the group consisting of oxygen, nitrogen or combination thereof.

13. The method of claim 11, wherein the deposited matrix material comprises about 0.05% to about 2% of aluminum containing inclusions.

14. A method of producing a ceramic matrix composite, comprising the steps of:
    forming a network of silicon carbide fibers;
    depositing an interface layer on the silicon carbide fibers before depositing a matrix material; and
    depositing the matrix material comprising silicon and carbon onto the silicon carbide fibers to form silicon carbide;
    wherein the depositing the matrix material comprises at least one of the group consisting of (1) depositing substantial amounts of carbon in excess of silicon carbide stoichiometric amounts, (2) introducing an oxygen containing gas, (3) introducing a halogen gaseous species, (4) introducing an organometallic gaseous species, or (5) a combination thereof and
    wherein the depositing the matrix material comprises depositing carbon in an amount in excess of the silicon carbide stoichiometric amount, wherein the excess amount is about 10 atomic percent to about 20 atomic percent.

15. The method of claim 14, wherein the matrix material has approximately the same creep resistance as that of the silicon carbide fibers.

16. The method of claim 14, wherein the interface layer includes boron nitride.

17. The method of claim 14, wherein the matrix material is deposited by chemical vapor infiltration.

18. The method of claim 14, further including processing the ceramic matrix composite by polymer infiltration and pyrolysis.

19. The method of claim 14, further including processing the ceramic matrix composite by slurry infiltration.

20. The method of claim 14, further including processing the ceramic matrix composite by melt infiltration.

21. The method of claim 14, wherein the matrix material comprises oxygen from introducing an oxygen containing gas during deposition of the matrix material.

22. The method of claim 14, wherein the matrix material comprises at least one element of the group consisting of aluminum, zirconium, boron, nitrogen, titanium, niobium, molybdenum, yttrium, ytterbium, or a combination thereof from introducing a halogen gaseous species during deposition of the matrix material.

23. The method of claim 14, wherein the matrix material comprises at least one element of the group consisting of aluminum, zirconium, titanium, niobium, molybdenum, yttrium, ytterbium or a combination thereof from introducing an organometallic gaseous species during deposition of the matrix material.

* * * * *